(12) United States Patent
Shinkaji et al.

(10) Patent No.: US 11,996,864 B2
(45) Date of Patent: May 28, 2024

(54) DECODER AND DATA PROCESSING DEVICE INCLUDING THE SAME

(71) Applicant: Samsung Display Co., Ltd., Yongin-si (KR)

(72) Inventors: Yasuhiko Shinkaji, Yokohama (JP); Masahiko Yoshiyama, Yokohama (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/095,709

(22) Filed: Jan. 11, 2023

(65) Prior Publication Data
US 2023/0268933 A1 Aug. 24, 2023

(30) Foreign Application Priority Data
Feb. 23, 2022 (KR) .......................... 10-2022-0023906

(51) Int. Cl.
*H03M 13/00* (2006.01)
*H03M 13/25* (2006.01)
*H03M 13/37* (2006.01)

(52) U.S. Cl.
CPC ..... *H03M 13/251* (2013.01); *H03M 13/3715* (2013.01)

(58) Field of Classification Search
None
See application file for complete search history.

(56) References Cited

U.S. PATENT DOCUMENTS

| 8,677,219 B2 * | 3/2014 | Lei .................... H03M 13/356 714/774 |
| 10,743,017 B2 | 8/2020 | Shima et al. |
| 2003/0046064 A1 * | 3/2003 | Moriya ............ G10L 19/0017 704/201 |
| 2007/0076803 A1 * | 4/2007 | Osamoto ............. H04N 19/14 375/E7.189 |
| 2011/0182345 A1 * | 7/2011 | Lei .................... H04L 1/0071 375/227 |
| 2012/0278680 A1 * | 11/2012 | Moon ................ G06F 11/1012 714/755 |

FOREIGN PATENT DOCUMENTS

| JP | 3406275 B2 | 5/2003 |
| KR | 101703228 B1 | 2/2017 |

* cited by examiner

*Primary Examiner* — Mujtaba M Chaudry
(74) *Attorney, Agent, or Firm* — CANTOR COLBURN LLP

(57) ABSTRACT

A data processing device includes an average correction processor that corrects input data based on an average value of the input data and outputs average correction data, and reversibly encodes and decodes the average value to generate a decoded average value, an irreversible encoder/decoder that encodes and decodes the average correction data and outputs first and second decoded data, a binary predictor that predicts a magnitude of a restoration error included in the second decoded data based on the first decoded data and the decoded average value and outputs a prediction result as binary data, an error estimator that outputs an estimation error based on the first decoded data, the second decoded data, and the decoded average value, and an operation circuit that outputs output data based on the second decoded data, the binary data, the estimation error, and the decoded average value.

18 Claims, 7 Drawing Sheets

Random Noise
Plane Sample 1

Random Noise
Plane Sample 2

DECODER AND DATA PROCESSING DEVICE INCLUDING THE SAME

This application claims priority to Korean Patent Application No. 10-2022-0023906, filed on Feb. 23, 2022, and all the benefits accruing therefrom under 35 U.S.C. § 119, the content of which in its entirety is herein incorporated by reference.

BACKGROUND

1. Field

Embodiments of the disclosure described herein relate to a data processing device.

2. Description of the Related Art

Techniques for encoding and/or decoding data may be broadly classified into a reversible method and an irreversible method. The reversible method has no loss, but has a low compression effect, and the irreversible method causes loss, but the compression effect is relatively high.

As described above, the reversible method and the irreversible method having different characteristics are used separately depending on the purpose. When a high compression ratio is desired, the irreversible method may be adopted, for example.

SUMMARY

When a restoration error due to compression deformation of data is large, data quality may be an issue, for example. A high-frequency component included in data causes a relatively large restoration error in irreversible encoding, for example.

Embodiments of the disclosure provide a data processing device capable of minimizing a restoration error while minimizing an increase in the size of encoded data.

Embodiments of the disclosure provide a decoder capable of restoring encoded data.

In an embodiment of the disclosure, a data processing device includes an average correction processor that calculates an average value of input data, corrects the input data based on the average value to output average correction data, and reversibly encodes and decodes the average value to generate a decoded average value, an irreversible encoder/decoder that encodes and decodes the average correction data to output first decoded data and second decoded data, a binary predictor that predicts a magnitude of a restoration error included in the second decoded data based on the first decoded data and the decoded average value and outputs a prediction result as binary data, an error estimator that outputs an estimation error based on the first decoded data, the second decoded data, and the decoded average value, and an operation circuit that outputs output data based on the second decoded data, the binary data, the estimation error, and the decoded average value.

In an embodiment, the average correction processor may include an average calculator that calculates the average value of the input data, a subtractor that calculates a difference value between the input data and the average value and outputs the difference value as the average correction data, a reversible encoder that reversibly encodes the average value and outputs an encoded average value, a memory that stores the encoded average value, and a reversible decoder that decodes the encoded average value and outputs the decoded average value.

In an embodiment, the irreversible encoder/decoder may include an auto-encoder that irreversibly encodes the average correction data to output a compressed signal, a quantizer that quantizes the compressed signal to output a quantized signal, a reversible encoder that reversibly encodes the quantized signal to output encoded data, a memory that stores the encoded data, a reversible decoder that decodes the encoded data stored in the memory to output the first decoded data, and an auto-decoder that decodes the first decoded data to output the second decoded data.

In an embodiment, the binary predictor may output the binary data of a first value when the restoration error is less than a reference value, and may output the binary data of a second value when the restoration error is greater than or equal to the reference value.

In an embodiment, the error estimator may include a neural network.

In an embodiment, the operation circuit may correct an error of the second decoded data based on the binary data and the estimation error, may generate an error correction data based on a corrected error of the second decoded data, and may output the output data based on the error correction data and the decoded average value.

In an embodiment, the operation circuit may include a first operator that multiplies the estimation error by the binary data, a second operator that adds an output of the first operator and the second decoded data to output the error correction data, and a third operator that adds the error correction data and the decoded average value to output the output data.

In an embodiment, the irreversible encoder/decoder may be trained to minimize a mean squared error between the average correction data and the second decoded data.

In an embodiment, the binary predictor may be trained to minimize a binary cross entropy error calculated from a first probability that the restoration error is less than a reference value and a second probability that the restoration error is greater than or equal to the reference value.

In an embodiment of the disclosure, a decoder includes an average correction processor that decodes an encoded average value to generate a decoded average value, an irreversible encoder/decoder that decodes encoded data to output first decoded data and second decoded data, a binary predictor that predicts a magnitude of a restoration error included in the second decoded data based on the first decoded data and the decoded average value and outputs a prediction result as binary data, an error estimator that outputs an estimation error based on the first decoded data, the second decoded data, and the decoded average value, and an operation circuit that outputs output data based on the second decoded data, the binary data, the estimation error, and the decoded average value.

In an embodiment, the average correction processor may include a memory that stores the encoded average value and a lossless codec decoder that decodes the encoded average value to output the decoded average value.

In an embodiment, the irreversible encoder/decoder may include a memory that stores the encoded data, a lossless codec decoder that decodes the encoded data stored in the memory to output the first decoded data, and an auto-decoder that decodes the first decoded data to output the second decoded data.

In an embodiment, the binary predictor may output the binary data of a first value when the restoration error is less than a reference value, and may output the binary data of a second value when the restoration error is greater than or equal to the reference value.

In an embodiment, the error estimator may include a neural network.

In an embodiment, the operation circuit may correct an error of the second decoded data based on the binary data and the estimation error, may generate an error correction data based on a corrected error of the second decoded data, and may output the output data based on the error correction data and the decoded average value.

In an embodiment, the operation circuit may include a first operator that multiplies the estimation error by the binary data, a second operator that adds an output of the first operator and the second decoded data to output the error correction data, and a third operator that adds the error correction data and the decoded average value to output the output data.

In an embodiment, the irreversible encoder/decoder may be trained to minimize a mean squared error between the average correction data and the second decoded data.

In an embodiment, the binary predictor may be trained to minimize a binary cross entropy error calculated from a first probability that the restoration error is less than a reference value and a second probability that the restoration error is greater than or equal to the reference value.

BRIEF DESCRIPTION OF THE DRAWINGS

The above and other embodiments and features of the disclosure will become apparent by describing in detail embodiments thereof with reference to the accompanying drawings.

DETAILED_DESCRIPTION

Figure 1:
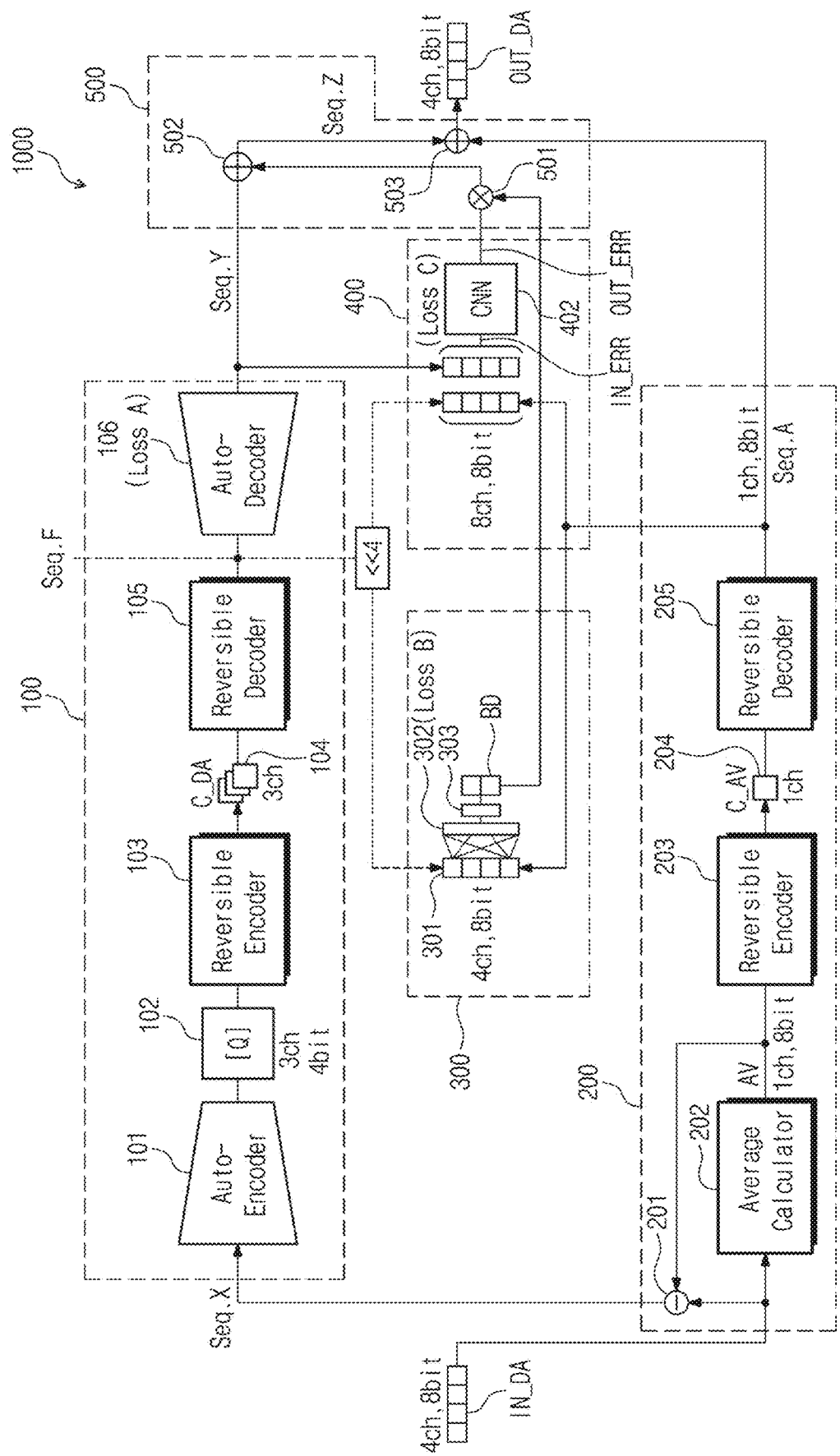
FIG. 1 is a block diagram of an embodiment of a data processing device, according to the disclosure.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components are exaggerated for effectiveness of description of technical contents. The term "and/or" includes one or more combinations of the associated listed items.

The terms "first", "second", etc. are used to describe various components, but the components are not limited by the terms. The terms are used only to differentiate one component from another component. A first component may be named as a second component, and vice versa, without departing from the spirit or scope of the disclosure, for example. A singular form, unless otherwise stated, includes a plural form.

Also, the terms "under", "beneath", "on", "above" are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless defined otherwise, all terms (including technical and scientific terms) used herein have the same meaning as commonly understood by one of ordinary skill in the art to which this disclosure belongs. In addition, terms such as terms defined in commonly used dictionaries should be interpreted as having a meaning consistent with the meaning in the context of the related technology, and should not be interpreted as an ideal or excessively formal meaning unless explicitly defined in the disclosure.

Hereinafter, embodiments of the disclosure will be described with reference to accompanying drawings.

FIG. 1 is a block diagram of an embodiment of a data processing device, according to the disclosure.

Referring to FIG. 1, a data processing device 1000 includes an irreversible encoder/decoder 100, an average correction processor 200, a binary predictor 300, an error estimator 400, and an operation circuit 500.

In an embodiment, the data processing device 1000 may process data for calibration of a light-emitting element and a light-receiving element.

It is difficult to manufacture light-emitting elements and light-receiving elements, which are two-dimensional semiconductor devices, to have uniform quality. When the manufactured light-emitting elements are assembled into a display device as it is and then are driven to emit light, a so-called Mura phenomenon occurs in many cases, for example. One of the methods for reducing the Mura phenomenon is to prepare calibration data in units of pixels (a light-emitting element or a light-receiving element) and to correct a light-emitting intensity when light is emitted.

As the number of pixels (a light-emitting element or a light-receiving element) increases, the size of a memory for storing calibration data increases, and the amount of data to be processed increases.

When calibration data are irreversibly compressed to minimize the calibration data and are used in a memory within a display device or a light-receiving device, restoration accuracy is important. When a restoration error is substantially large, since the restoration error may affect the quality of the product, it is desired to suppress the restoration error as low as possible.

Figure 2A:
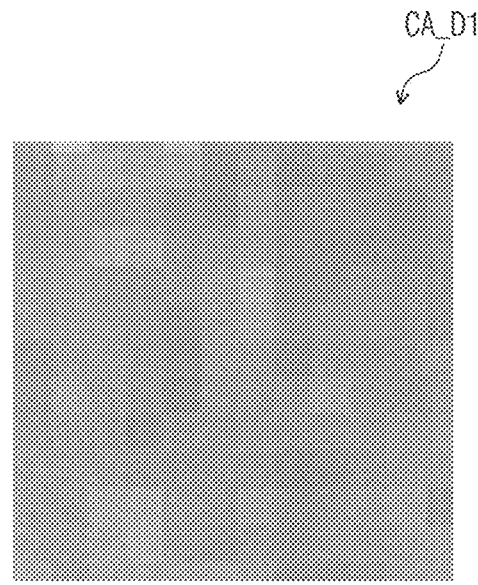
FIGS. 2A and 2B are diagrams illustrating calibration data as an example.
Figure 2B:
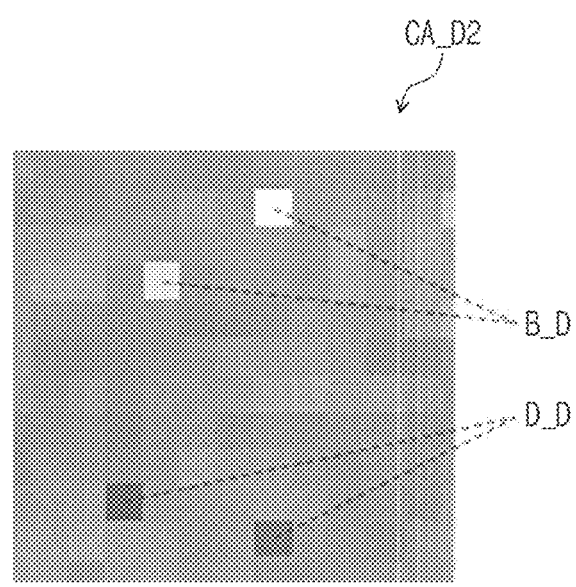

FIGS. 2A and 2B are diagrams illustrating calibration data as an example.

As illustrated in FIGS. 2A and 2B, calibration data CA_D1 and CA_D2 may include random noise caused by a semiconductor manufacturing process.

In the calibration data CA_D1 illustrated in FIG. 2A, a luminance deviation between pixels is not substantially large. However, the calibration data CA_D2 illustrated in FIG. 2B include high luminance data B_D and low luminance data D_D.

Figure 3:
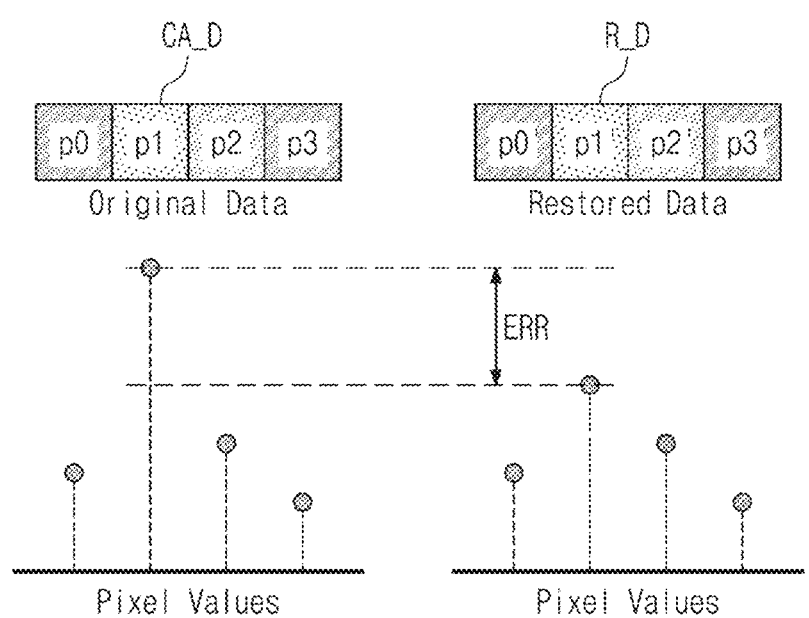
FIG. 3 is a diagram illustrating compression of calibration data as an example.

FIG. 3 is a diagram illustrating compression of calibration data as an example.

Referring to FIG. 3, calibration data CAD may be irreversibly compressed in units of four pixels, for example. The calibration data CAD may include data p0, p1, p2, and p3 corresponding to four pixels, and the data p1 may be the high luminance data B_D illustrated in FIG. 2B.

The calibration data CAD are compressed by an encoder and are restored by a decoder. Restored data R D may include data p0', p1', p2', and p3' corresponding to four pixels.

Since the high luminance pixel and the low luminance pixel are high-frequency components, the restored data R D after compression include a large error ERR. The error ERR may deteriorate a display quality of the display device.

Referring back to FIG. 1, in an embodiment, the data processing device 1000 may perform encoding/decoding in units of four pixels (or channels). Data corresponding to one pixel may be an 8-bit signal. The data processing device 1000 receives calibration data corresponding to four pixels (or four channels) as input data IN_DA.

The average correction processor 200 calculates an average value AV of the input data IN_DA. Also, the average correction processor 200 calculates a difference between the input data IN_DA and the average value AV, and outputs average correction data Seq.X. The average correction data Seq.X is provided to the irreversible encoder/decoder 100. The average correction processor 200 reversibly encodes the average value AV to generate an encoded average value C_AV, and decodes the encoded average value C_AV to output a decoded average value Seq.A. In an embodiment, the average correction processor 200 includes a subtractor 201, an average calculator 202, a reversible encoder 203, a memory 204, and a reversible decoder 205, which will be described later.

The irreversible encoder/decoder 100 decodes the average correction data Seq.X and outputs first decoded data Seq.F. In an embodiment, the irreversible encoder/decoder 100 includes an auto-encoder 101, a quantizer 102, a reversible encoder (or a lossless encoder) 103, a memory 104, a reversible decoder (or a lossless decoder) 105, and an auto-decoder 106, which will be described later.

The binary predictor 300 receives 4-channel data 301 in which the first decoded data Seq.F of 3-channel and the decoded average value Seq.A of 1-channel are combined. The binary predictor 300 predicts a magnitude of a restoration error included in second decoded data Seq.Y based on the first decoded data Seq.F and the decoded average value Seq.A, and outputs a prediction result as binary data BD. When the restoration error of the second decoded data Seq.Y, which is the decoding result of the irreversible encoder/decoder 100, is predicted to be less than a reference value, the binary data BD may be '0'. In an embodiment, when a restoration error of the second decoded data Seq.Y is greater than or equal to the reference value, the binary data BD may be '1'.

The error estimator 400 receives 4-channel data in which the first decoded data Seq.F of 3-channel and the decoded average value Seq.A of 1-channel of the binary predictor 300 are combined, and receives the second decoded data Seq.Y of 4-channel. The error estimator 400 outputs an estimation error OUT ERR of 4-channel.

The operation circuit 500 includes operators 501, 502, and 503. The operation circuit 500 receives the estimation error OUT ERR of 4-channel from the error estimator 400, the binary data BD from the binary predictor 300, the second decoded data Seq.Y from the irreversible encoder/decoder 100, and the decoded average value Seq.A from the average correction processor 200. The operation circuit 500 corrects an error of the second decoded data Seq.Y based on the estimation error OUT ERR and the binary data BD, and outputs error correction data Seq.Z. In addition, the operation circuit 500 outputs output data OUT_DA by adding the error correction data Seq.Z and the decoded average value Seq.A.

Figure 4:
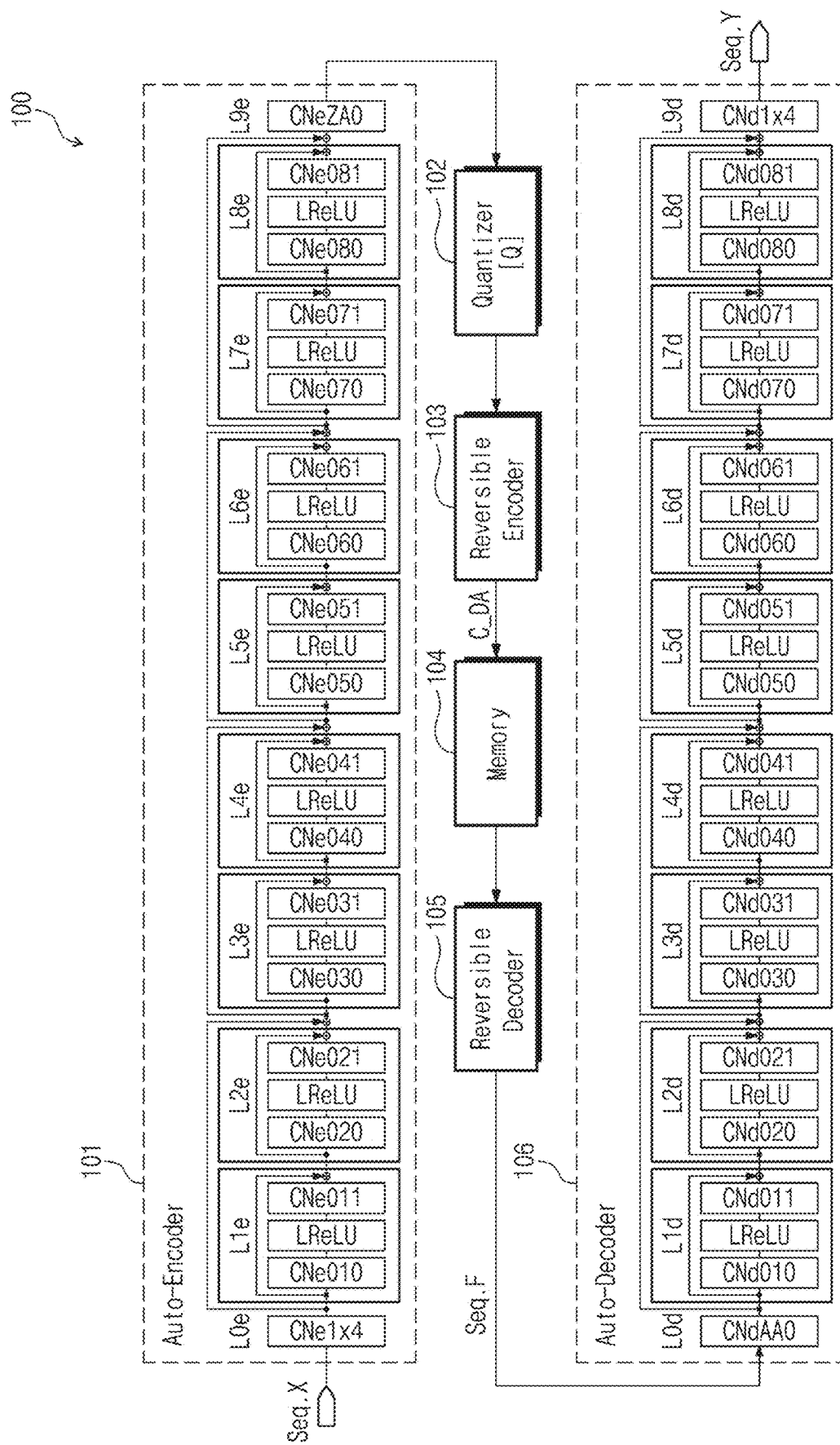
FIG. 4 is a block diagram illustrating a configuration of an irreversible encoder/decoder.

FIG. 4 is a block diagram illustrating a configuration of the irreversible encoder/decoder 100.

Referring to FIG. 4, the auto-encoder 101 irreversibly compresses the average correction data Seq.X of 4-channel, and outputs a compressed signal of 3-channel. The quantizer 102 may output a quantized signal obtained by quantizing the compressed signal from the auto-encoder 101 into a 4-bit signal. The reversible encoder 103 reversibly encodes the quantized signal to output encoded data C_DA.

The average correction data Seq.X of 4-channel input to the irreversible encoder/decoder 100 may be converted to the encoded data C_DA of 3-channel by the auto-encoder 101, the quantizer 102, and the reversible encoder 103. In an embodiment, one channel of the average correction data Seq.X may be 8 bits, and one channel of the encoded data C_DA may be 4 bits. The encoded data C_DA may be stored in the memory 104.

The reversible decoder 105 decodes the encoded data C_DA, and outputs the first decoded data seq.F.

The auto-decoder 106 decodes the first decoded data seq.F, and outputs the second decoded data Seq.Y. The second decoded data Seq.Y may be data of 4-channel, and each channel may be 8 bits.

FIG. 4 illustrates functional blocks of the auto-encoder 101 and the auto-decoder 106. However, the disclosure is not limited thereto.

In an embodiment, the reversible encoder 103 and the reversible decoder 105 may apply an arithmetic code method, a Huffman code method, etc.

Figure 5:
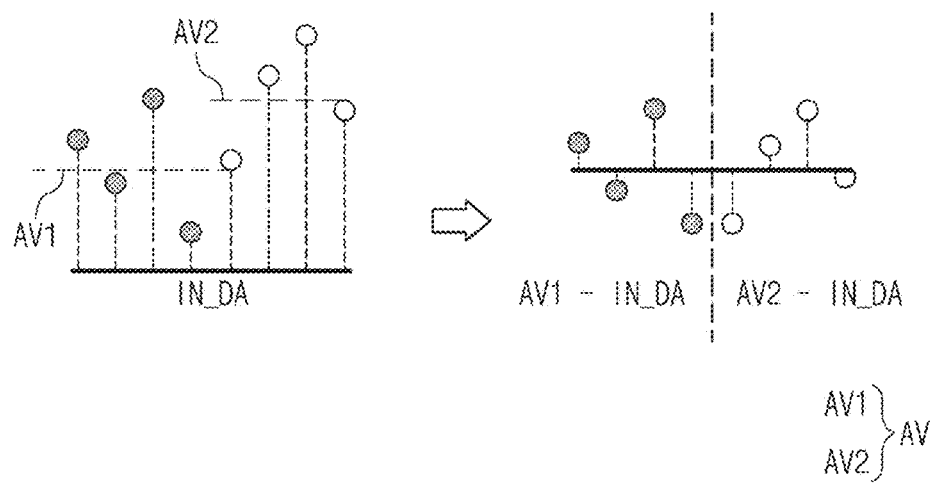
FIG. 5 is a diagram for describing an operation of an average correction processor.

FIG. 5 is a diagram for describing an operation of the average correction processor 200.

Referring to FIGS. 1 and 5, the average correction processor 200 mitigates random noise of the input data IN_DA and reduces the luminance deviation between pixels.

As illustrated in FIG. 5, the average calculator 202 in the average correction processor 200 receives the input data IN_DA and calculates the average value AV in units of 4-channel (pixels). The subtractor 201 calculates a difference between the average value AV and the input data IN_DA. In an embodiment, when the average value AV is AV1, the difference between the average value AV and the input data IN_DA is AV1-IN_DA, and when the average value AV is AV2, the difference between the average value AV and the input data IN_DA is AV2-IN_DA, for example.

The difference between the average value AV and the input data IN_DA may be provided to the irreversible encoder/decoder 100 as the average correction data Seq.X.

The average value AV output from the average calculator 202 is compressed by the reversible encoder 203 to output the encoded average value C_AV. The encoded average value C_AV may be stored in the memory 204.

The reversible decoder 205 decodes the encoded average value C_AV and outputs the decoded average value Seq.A.

Figure 6:
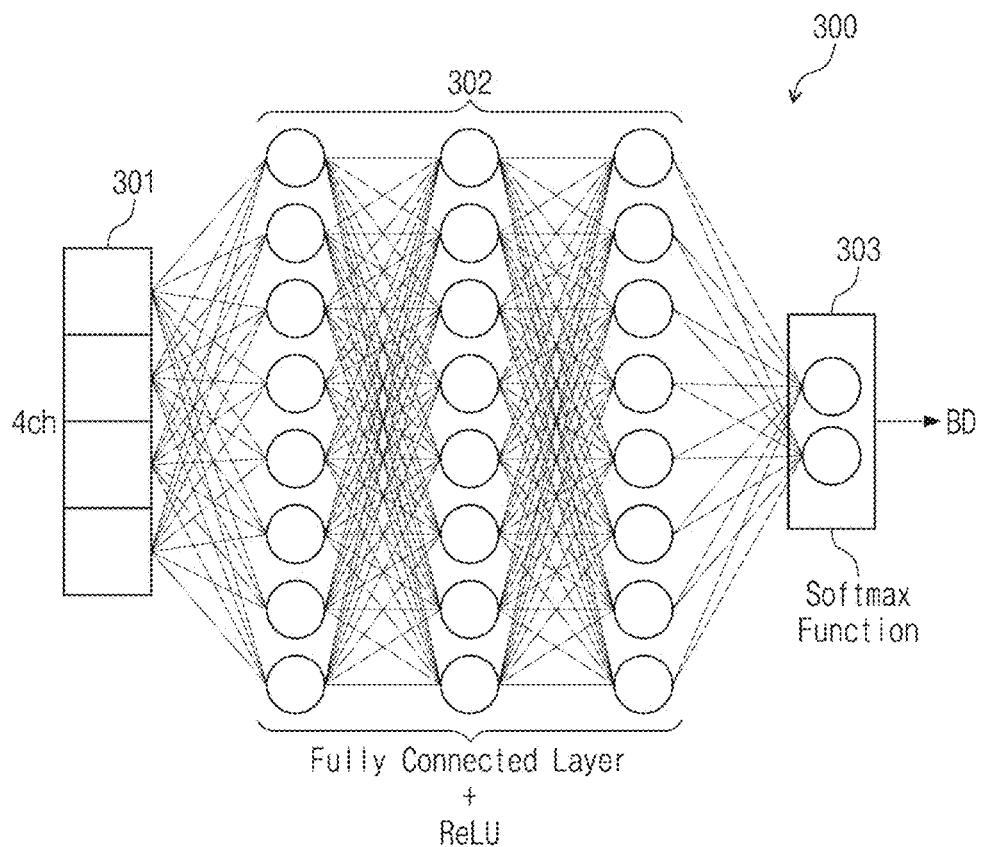
FIG. 6 is a diagram for describing an operation of a binary predictor.

FIG. 6 is a diagram for describing an operation of a binary predictor.

Referring to FIGS. 1 and 6, the binary predictor 300 receives the 4-channel data 301 in which the first decoded data Seq.F of 3-channel and the decoded average value Seq.A of 1-channel are combined with each other.

A neural network responsible for class classification of the binary predictor 300 may include a fully connected layer 302 including an activation function ReLU and a SoftMax layer 303 for calculating a binary occurrence probability. An output of the SoftMax layer 303 may be the binary data BD.

In an embodiment, when it is predicted that a large restoration error is not included in the decoding result of the irreversible encoder/decoder 100, that is, the first decoded data Seq.F of 3-channel, the binary data BD may be '0'.

In an embodiment, when it is predicted that a large restoration error is included in the decoding result of the irreversible encoder/decoder 100, that is, the first decoded data Seq.F of 3-channel, the binary data BD may be '1'.

Figure 7:
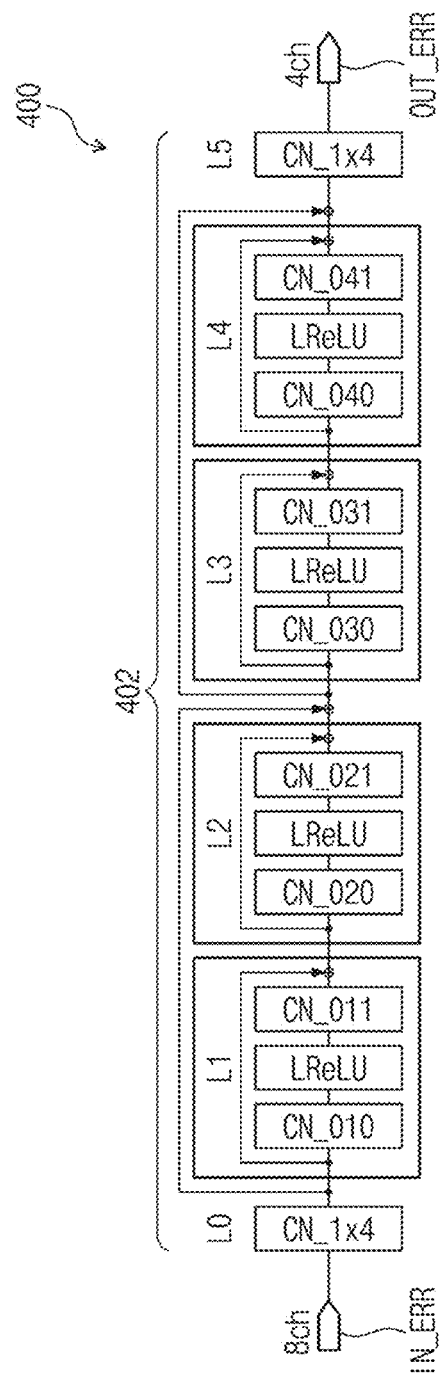
FIG. 7 is a block diagram illustrating an embodiment of a configuration of an error estimator.

FIG. 7 is a block diagram illustrating an embodiment of a configuration of an error estimator.

Referring to FIGS. 1 and 7, the error estimator 400 receives an input IN_ERR of 8-channel. The 8-channel input IN_ERR includes the 4-channel data in which the first decoded data Seq.F of 3-channel and the decoded average value Seq.A of 1-channel of the binary predictor 300 are combined with each other, and the second decoded data Seq.Y of 4-channel.

The neural network 402 responsible for error estimation has the same configuration as the direct connection between the auto-encoder 101 and the auto-decoder 106 of the irreversible encoder/decoder 100 illustrated in FIG. 4, and the number of layers thereof is relatively small compared to the auto-encoder 101 and the auto-decoder 106. The neural network 402 outputs the estimation error OUT ERR of 4-channel. In an embodiment, the neural network 402 may be a convolutional neural network ("CNN"), but the disclosure is not limited thereto.

The operation circuit 500 includes the operators 501, 502, and 503.

The operator (also referred to as a first operator) 501 multiplies the estimation error OUT ERR of 4-channel from the error estimator 400 by the binary data BD from the binary predictor 300.

The operator (also referred to as a second operator) 502 outputs the error correction data Seq.Z by adding an output of the operator 501 and the second decoded data Seq.Y from the irreversible encoder/decoder 100.

The operator (also referred to as a third operator) 503 outputs the output data OUT_DA by adding the error correction data Seq.Z that is the output of the operator 502 and the decoded average value Seq.A from the average correction processor 200.

In an embodiment, when it is predicted that a large restoration error is not included in the decoding result of the irreversible encoder/decoder 100, that is, the second decoded data Seq.Y of 3-channel, the binary data BD may be '0'. In this case, '0' may be output through the operator 501. The second decoded data Seq.Y and the decoded average value Seq.A may be added by the operators 502 and 503 to output the output data OUT_DA. That is, the estimation error OUT ERR of 4-channel is not reflected in the output data OUT_DA.

When it is predicted that a large restoration error is included in the decoding result of the irreversible encoder/decoder 100, that is, the first decoded data Seq.F of 3-channel, the binary data BD may be '1'. In this case, the estimation error OUT ERR of 4-channel may be output through the operator 501. The second decoded data Seq.Y, the estimation error OUT ERR of 4-channel, and the decoded average value Seq.A may be added by the operators 502 and 503 to output the output data OUT_DA. Therefore, when it is predicted that a large restoration error is included in the first decoded data Seq.F of 3-channel, the estimation error OUT ERR of 4-channel may be reflected in the output data OUT_DA.

The irreversible encoder/decoder 100, the binary predictor 300, and the error estimator 400 may require training of a neural network. A loss function 'Loss A' used for machine-learning the neural network of the irreversible encoder/decoder 100 is expressed by Equation 1 below.

$$LossA = MSE(Y, X) = \frac{1}{n}\sum_{i}^{n}(Y - X)^2 \quad \text{[Equation 1]}$$

In Equation 1, MSE denotes a mean squared error, 'X' denotes the average correction data Seq.X input to the auto-encoder 101, 'Y' denotes the second decoded data Seq.Y output from the auto-decoder 106, n is a natural number, and i is a natural number equal to or less than n.

The irreversible encoder/decoder 100 may be trained to minimize a mean squared error between the average correction data Seq.X and the second decoded data Seq.Y.

A loss function 'Loss B' used for machine-learning the neural network of the binary predictor 300 is as illustrated in Equation 2 below.

$$LossB = BCE(t_i, P_i) = -\sum_{i=1}^{2}t_i\log(P_i) \quad \text{[Equation 2]}$$

In Equation 2, BCE denotes a binary cross entropy, 'it' denotes a truth label, and 'Pi' denotes a SoftMax probability for the i-th class. The binary predictor 300 may be trained to minimize a binary cross entropy error calculated from a probability P0 that an error greater than or equal to a predetermined value is not included in the decoding result and a probability P1 that an error greater than or equal to a predetermined value is included in the decoding result.

A loss function 'Loss C' used for machine-learning the neural network of the error estimator 400 is as illustrated in Equation 3 below.

$$LossC = \alpha\, MSE(Z, X) + (1 - \alpha)MAX(Z, X) \quad \text{[Equation 3]}$$

$$= \frac{\alpha}{n}\sum_{i}^{n}(Z - X)^2 + (1 - \alpha)\sum_{i}^{k}\max(|Z - X|)$$

In Equation 3, MSE denotes a mean squared error, MAX denotes a sum of the maximum values, 'Z' denotes the error correction data Seq.Z output from the operator 502, 'X' denotes the average correction data Seq.X input to the auto-encoder 101, and k is a natural number.

The loss function 'Loss C' of the error estimator 400 is a sum of the mean squared error 'LossMSE' between the average correction data Seq.X input to the auto-encoder 101 and the error correction data Seq.Z of the final, and losses 'LossMAX' obtained by extracting and summing error values of 'Z' and 'X' by 'k'-number from the largest. An 'a' denotes a ratio of LossMSE to LossMAX. In an embodiment, the 'a' is 0.5. An 'n' corresponds to the number of batches of machine-learning, and is a value dependent on the machine-learning environment, for example. Also, 'k' (<n) may be the number of high luminance pixels and low luminance pixels in the arrangement.

Machine-learning of the data processing device 1000 is performed according to the following procedure. First, the irreversible encoder/decoder 100 is trained. Then, the binary predictor 300 is trained. Then, the error estimator 400 is trained by reflecting the machine-learning results of the irreversible encoder/decoder 100 and the binary predictor 300.

The irreversible encoder/decoder 100 and the binary predictor 300 may be independently trained in parallel. After the machine-learning of the irreversible encoder/decoder 100 and the binary predictor 300 is completed, it is possible to train the error estimator 400.

By multiplying the machine-learning result of the binary predictor 300 and the machine-learning result of the error estimator 400, as a result, it is important that machine-learning is performed only on data including a large restoration error.

Figure 8:
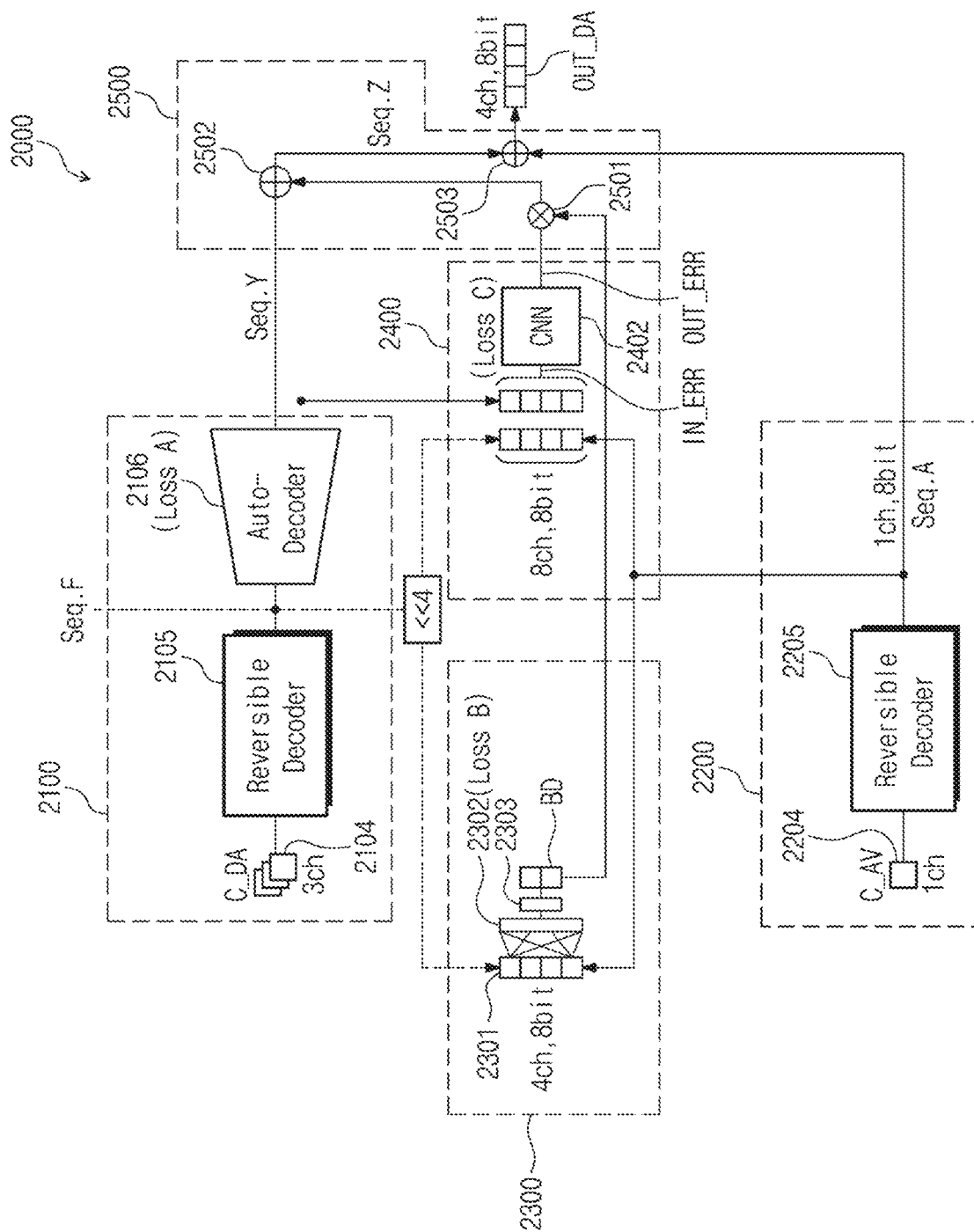
FIG. 8 is a block diagram of an embodiment of a decoder, according to the disclosure.

FIG. 8 is a block diagram of an embodiment of a decoder, according to the disclosure.

Referring to FIG. 8, a decoder 2000 includes an irreversible decoder 2100, an average value decoder 2200, a binary predictor 2300, an error estimator 2400, and an operation circuit 2500.

Some configurations of the decoder 2000 illustrated in FIG. 8 are the same as those of the data processing device 1000 illustrated in FIG. 1, and thus additional descriptions will be omitted to avoid redundancy.

The average value decoder 2200 includes a memory 2204 and a reversible decoder 2205. The memory 2204 and the reversible decoder 2205 may operate similarly to the memory 204 and the reversible decoder 205 illustrated in FIG. 1.

The memory 2204 stores the encoded average value C_AV. The encoded average value C_AV may be a value calculated in advance by the data processing device 1000 illustrated in FIG. 1.

The reversible decoder 2205 decodes the encoded average value C_AV and outputs the decoded average value Seq.A.

The irreversible decoder 2100 includes a memory 2104, a reversible decoder 2105, and an auto-decoder 2106.

The memory 2104 stores the encoded data C_DA. The encoded data C_DA may be data processed in advance by the reversible encoder 103 of the data processing device 1000 illustrated in FIG. 1.

The reversible decoder 2105 decodes the encoded data C_DA and outputs the first decoded data Seq.F.

The auto-decoder 2106 decodes the first decoded data Seq.F, and outputs the second decoded data Seq.Y.

The binary predictor 2300 may include a fully connected layer 2302 and a SoftMax layer 2303 for calculating a binary occurrence probability. The binary predictor 2300 receives 4-channel data 2301 in which the first decoded data Seq.F of 3-channel and the decoded average value Seq.A of 1-channel are combined with each other. The binary predictor 2300 predicts a restoration error of the second decoded data Seq.Y based on the decoded average value Seq.A and outputs binary data BD corresponding to the prediction result. When the restoration error of the second decoded data Seq.Y, which is the decoding result of the irreversible encoder/decoder 100, is predicted to be less than a reference value, the binary data BD may be '0'. In an embodiment, when a restoration error of the second decoded data Seq.Y is greater than or equal to the reference value, the binary data BD may be '1'.

The error estimator 2400 receives 4-channel data in which the first decoded data Seq.F of 3-channel and the decoded average value Seq.A of 1-channel of the binary predictor 2300 are combined with each other and the second decoded data Seq.Y of 4-channel. The error estimator 2400 outputs the estimation error OUT_ERR of 4-channel. The error estimator 2400 may include a neural network 2402 may be similar to the neural network 402 in the embodiment of FIG. 1.

The operation circuit 2500 includes operators 2501, 2502, and 2503. The operation circuit 2500 receives the estimation error OUT_ERR of 4-channel from the error estimator 2400, the binary data BD from the binary predictor 2300, the second decoded data Seq.Y from the irreversible decoder 2100, and the decoded average value Seq.A from the average value decoder 2200. The operation circuit 2500 corrects the error of the second decoded data Seq.Y based on the estimation error OUT_ERR and the binary data BD, and outputs the error correction data Seq.Z. In addition, the operation circuit 500 outputs output data OUT_DA by adding the error correction data Seq.Z and the decoded average value Seq.A.

The decoder 2000 illustrated in FIG. 8 may be applied to a light-receiving device such as a camera and a light-emitting display device such as a display.

In an embodiment of the disclosure, a data processing device may minimize a restoration error while minimizing an increase in the size of encoded data. In addition, in an embodiment of the disclosure, a decoder may restore encoded data.

Although an embodiment of the disclosure has been described for illustrative purposes, those skilled in the art will appreciate that various modifications, and substitutions are possible, without departing from the scope and spirit of the disclosure as disclosed in the accompanying claims. Accordingly, the technical scope of the disclosure is not limited to the detailed description of this specification, but should be defined by the claims.

What is claimed is:

1. A data processing device comprising:
an average correction processor which calculates an average value of input data, outputs average correction data based on the input data and the average value, encodes and decodes the average value, and generates a decoded average value;
an irreversible encoder/decoder which encodes and decode the average correction data and outputs first decoded data and second decoded data;
a binary predictor which predicts a magnitude of a restoration error included in the second decoded data based on the first decoded data and the decoded average value and outputs a prediction result as binary data;
an error estimator which outputs an estimation error based on the first decoded data, the second decoded data, and the decoded average value; and
an operation circuit which outputs output data based on the second decoded data, the binary data, the estimation error, and the decoded average value.

2. The data processing device of claim 1, wherein the average correction processor includes:
an average calculator which calculates the average value of the input data;
a subtractor which calculates a difference value between the input data and the average value and outputs the difference value as the average correction data;
a reversible encoder which reversibly encodes the average value and outputs an encoded average value;
a memory which stores the encoded average value; and
a reversible decoder which decodes the encoded average value and outputs the decoded average value.

3. The data processing device of claim 1, wherein the irreversible encoder/decoder includes:
an auto-encoder which irreversibly encodes the average correction data and outputs a compressed signal;
a quantizer which quantizes the compressed signal and outputs a quantized signal;
a reversible encoder which reversibly encodes the quantized signal and outputs encoded data;
a memory which stores the encoded data;
a reversible decoder which decodes the encoded data stored in the memory and outputs the first decoded data; and
an auto-decoder which decodes the first decoded data and outputs the second decoded data.

4. The data processing device of claim 1, wherein the binary predictor outputs the binary data of a first value when the restoration error is less than a reference value, and
wherein the binary predictor outputs the binary data of a second value when the restoration error is greater than or equal to the reference value.

5. The data processing device of claim 1, wherein the error estimator includes a neural network.

6. The data processing device of claim 1, wherein the operation circuit corrects an error of the second decoded data based on the binary data and the estimation error, generates an error correction data based on a corrected error of the second decoded data, and outputs the output data based on the error correction data and the decoded average value.

7. The data processing device of claim 6, wherein the operation circuit includes:
a first operator which multiplies the estimation error by the binary data;
a second operator which adds an output of the first operator and the second decoded data and outputs the error correction data; and
a third operator which adds the error correction data and the decoded average value and outputs the output data.

8. The data processing device of claim 1, wherein the irreversible encoder/decoder is trained to minimize a mean squared error between the average correction data and the second decoded data.

9. The data processing device of claim 1, wherein the binary predictor is trained to minimize a binary cross entropy error calculated from a first probability which the restoration error is less than a reference value and a second probability which the restoration error is greater than or equal to the reference value.

10. A decoder comprising:
an average correction processor which decodes an encoded average value and generates a decoded average value;
an irreversible encoder/decoder which decodes encoded data and outputs first decoded data and second decoded data;
a binary predictor which predicts a magnitude of a restoration error included in the second decoded data based on the first decoded data and the decoded average value and outputs a prediction result as binary data;
an error estimator which outputs an estimation error based on the first decoded data, the second decoded data, and the decoded average value; and
an operation circuit which outputs output data based on the second decoded data, the binary data, the estimation error, and the decoded average value.

11. The decoder of claim 10, wherein the average correction processor includes:
a memory which stores the encoded average value; and
a reversible decoder which decodes the encoded average value and outputs the decoded average value.

12. The decoder of claim 10, wherein the irreversible encoder/decoder includes:
a memory which stores the encoded data;
a reversible decoder which decodes the encoded data stored in the memory and outputs the first decoded data; and
an auto-decoder which decodes the first decoded data and outputs the second decoded data.

13. The decoder of claim 10, wherein the binary predictor outputs the binary data of a first value when the restoration error is less than a reference value, and wherein the binary predictor outputs the binary data of a second value when the restoration error is greater than or equal to the reference value.

14. The decoder of claim 10, wherein the error estimator includes a neural network.

15. The decoder of claim 10, wherein the operation circuit corrects an error of the second decoded data based on the binary data and the estimation error, generates an error correction data based on a corrected error of the second decoded data, and outputs the output data based on the error correction data and the decoded average value.

16. The decoder of claim 15, wherein the operation circuit includes:
a first operator which multiplies the estimation error by the binary data;
a second operator which adds an output of the first operator and the second decoded data and outputs the error correction data; and
a third operator which adds the error correction data and the decoded average value and outputs the output data.

17. The decoder of claim 10, wherein the irreversible encoder/decoder is trained to minimize a mean squared error between an average correction data based on an average value of input data and the second decoded data.

18. The decoder of claim 10, wherein the binary predictor is trained to minimize a binary cross entropy error calculated from a first probability which the restoration error is less than a reference value and a second probability which the restoration error is greater than or equal to the reference value.

* * * * *